(12) United States Patent
Joon

(10) Patent No.: US 7,611,918 B2
(45) Date of Patent: Nov. 3, 2009

(54) CMOS IMAGE SENSOR AND METHOD FOR FABRICATING THE SAME

(75) Inventor: Hwang Joon, Cheongju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 310 days.

(21) Appl. No.: 11/448,428

(22) Filed: Jun. 7, 2006

(65) Prior Publication Data

US 2006/0273349 A1 Dec. 7, 2006

(30) Foreign Application Priority Data

Jun. 7, 2005 (KR) .................. 10-2005-0048484

(51) Int. Cl.
*H01L 27/10* (2006.01)
(52) U.S. Cl. ................. 438/48; 257/204; 257/184; 257/187; 257/461; 257/E21.229; 257/E21.224; 257/440; 438/73
(58) Field of Classification Search ........... 257/440, 257/207, 204, 184, 259, 292, 461, E21.229, 257/E21.224; 438/73, 48
See application file for complete search history.

(56) References Cited

U.S. PATENT DOCUMENTS

| | | | | |
|---|---|---|---|---|
| 5,825,071 | A * | 10/1998 | Takakura | .................. 257/440 |
| 5,965,875 | A | 10/1999 | Merrill | |
| 6,359,323 | B1 * | 3/2002 | Eom et al. | .................. 257/440 |
| 6,632,702 | B2 * | 10/2003 | Eom et al. | ..................... 438/73 |
| 2004/0080638 | A1 * | 4/2004 | Lee | ............................. 348/272 |

FOREIGN PATENT DOCUMENTS

| | | |
|---|---|---|
| KR | 10-2002-0064890 | 4/2004 |
| KR | 10-2002-0086448 | 7/2004 |

* cited by examiner

*Primary Examiner*—Wael Fahmy
*Assistant Examiner*—Marc Armand
(74) *Attorney, Agent, or Firm*—Saliwanchik, Lloyd & Saliwanchik

(57) ABSTRACT

A CMOS image sensor and a method of fabricating the same are provided. The CMOS image sensor includes: an epitaxial layer of a first conductivity type, formed in a semiconductor substrate of the first conductivity type; a blue photodiode region of a second conductivity type, formed in the epitaxial layer at a first depth; a green photodiode region of the second conductivity type, spaced apart from the blue photodiode region and formed in the epitaxial layer at a second depth larger than the first depth; and a red photodiode region of the second conductivity type, spaced apart from the green photodiode region and formed in the epitaxial layer at a third depth larger than the second depth.

8 Claims, 11 Drawing Sheets

CMOS IMAGE SENSOR AND METHOD FOR FABRICATING THE SAME

RELATED APPLICATION

This application claims the benefit under 35 U.S.C. §119(e) of Korean Patent Application No. 10-2005-0048484, filed Jun. 7, 2005, which is incorporated herein by reference in its entirety.

FIELD OF THE INVENTION

The present invention relates to a CMOS image sensor, and more particularly, to a CMOS image sensor having improved characteristic and a method for fabricating the same.

BACKGROUND OF THE INVENTION

Generally, an image sensor is a semiconductor device that converts an optical image to an electric signal. An image sensor can be classified as a charge coupled device (CCD) or a complementary metal oxide silicon (CMOS) image sensor.

The CCD includes a plurality of photo diodes for converting an optical signal into an electric signal arranged in a matrix pattern, a plurality of vertical charge coupled devices formed between the photo diodes for transferring electric charges generated from the photo diodes in a vertical direction, a horizontal charge coupled device for transferring the electric charges transferred from the vertical charge coupled devices in a horizontal direction, and a sense amplifier for outputting an electric signal by sensing the electric charges transferred in the horizontal direction and outputting an electric signal.

The major drawbacks to the CCD are the complicated driving method and high power consumption. Also, the method for fabricating the CCD can be complicated because a multi-level photo process is required.

In addition, it is difficult to integrate a control circuit, a signal processing circuit, an analog/digital (A/D) converter, and other circuits with the CCD. This makes it difficult to reduce the size of a product employing the CCD.

Therefore, the CMOS image sensor has been developed as a next-generation image sensor that can overcome the drawbacks of the CCD.

The CMOS image sensor is a device employing a switching method in which outputs of the unit pixels are sequentially detected by MOS transistors, the number of which can be identical to that of the number of unit pixels. The MOS transistors are formed on a semiconductor substrate, in which a control circuit and a signal processing circuit are used as peripheral circuits.

That is, a photodiode and a MOS transistor are formed in each unit pixel so that the CMOS image sensor realizes an image by sequentially detecting electric signals of the unit pixels using the switching method.

Since the CMOS image sensor uses CMOS fabrication technology, the power consumption is low and the fabrication process is simplified due to the reduced number of photo processes.

In the CMOS image sensor, since the control circuit, the signal processing circuit, and the A/D converter circuit can be integrated with a CMOS image sensor chip, the size of the product employing the CMOS image sensor can be reduced.

Therefore, the CMOS image sensor has been widely used in a variety of applications such as digital cameras and digital video cameras.

The CMOS image sensor can be classified into types according to the number of transistors, such as a 3T-type, 4T-type, and 5T-type. For example, the 3T-type CMOS image sensor includes one photodiode and three transistors, and the 4T-type CMOS image sensor includes one photodiode and four transistors.

The equivalent circuit and layout of the unit pixel of the 3T-type CMOS image sensor will now be described.

FIG. 1 is an equivalent circuit diagram of the unit pixel of a 3T-type CMOS image sensor and FIG. 2 is a layout of the unit of the 3T-type CMOS image sensor.

Referring to FIG. 1, the 3T-type CMOS image sensor includes a single photodiode PD and three NMOS transistors $T_1$, $T_2$, and $T_3$.

The photodiode PD is connected to a drain of the first NMOS transistor $T_1$ and a gate of the second NMOS transistor $T_2$.

Sources of the first and second NMOS transistors $T_1$ and $T_2$ are connected to a voltage line through which a reference voltage VR is supplied. A gate of the first NMOS transistor $T_1$ is connected to a reset line through which a reset voltage RST is supplied.

A source of the third NMOS transistor $T_3$ is connected to a drain of the second NMOS transistor $T_2$, a drain of the third NMOS transistor $T_3$ is connected to a read circuit (not shown) through a signal line, and a gate of the third NMOS transistor $T_3$ is connected to a column select line through which a select signal SLCT is supplied.

The first NMOS transistor $T_1$ is a reset transistor Rx for resetting photocharges accumulated in the photodiode PD, the second NMOS transistor $T_2$ is a drive transistor Dx acting as a source follower buffer amplifier, and the third NMOS transistor $T_3$ is a select transistor Sx performing an addressing through a switching operation.

Referring to FIG. 2, in the unit pixel of the 3T-type CMOS image sensor, a single photodiode 20 is formed in a wide portion of an active region 10, and gate electrodes 120, 130, and 140 of three transistors are formed to overlap one another in the remaining portion of the active region 10.

That is, the reset transistor Rx is formed by the gate electrode 120, the drive transistor Dx is formed by the gate electrode 130, and the select transistor Sx is formed by the gate electrode 140.

Impurities are doped into the active region 10 of the transistors except for below the gate electrodes 30, 40 and 50, thereby forming a source/drain region of each transistor.

A power voltage Vdd can be applied to the source/drain region between the reset transistor Rx and the drive transistor Dx. In addition, the source/drain region disposed at a side of the select transistor Sx can be connected to a read circuit (not shown).

The gate electrodes 120, 130 and 140 can be connected to respective signal lines (not shown). Each signal line can be provided with a pad connected to an external drive circuit.

The respective signal lines with the pads and the subsequent processes will be described below.

FIGS. 3A to 3E are sectional views illustrating a method for fabricating a related art CMOS image sensor, taken along line III-III' of FIG. 2.

Referring to FIG. 3A, an epitaxial process is performed on a heavily-doped $P^{++}$ semiconductor substrate 61 to form a lightly-doped $P^-$ epitaxial layer 62.

The lightly-doped $P^-$ epitaxial layer 62 is formed to have a thickness of 4-7 μm.

Then, an active region and a device isolation region are defined in the semiconductor substrate 61, and a device isolation layer 63 is formed in the device isolation region using an STI or LOCOS process.

A gate insulating layer 64 and a conductive layer such as a high-concentration polycrystalline silicon layer are sequentially deposited on the entire surface of the epitaxial layer 62. The conductive layer and the gate insulating layer 64 are then selectively removed to form a gate electrode 65.

Referring to FIG. 3B, a first photoresist layer 66 is coated on the entire surface of the resulting structure including the gate electrode 65, and is patterned using an exposure process and a development process to cover the photodiode region and expose the source/drain region of each transistor.

Using the patterned first photoresist layer 66 as a mask, $n^-$ impurity ions are implanted into the exposed source/drain region to form an $n^-$ diffusion region 67.

Referring to FIG. 3C, the first photoresist layer 66 is removed and a second photoresist layer 68 is coated on the entire surface of the semiconductor substrate 61. The second photoresist layer 68 is patterned to expose blue, green and red photodiode regions using an exposure process and a development process.

Using the patterned second photoresist layer 68 as a mask, $n^-$ impurity ions are implanted into the epitaxial layer 62 to form $n^-$ diffusion region 69 in the photodiode regions.

The $n^-$ diffusion region 69 of each photodiode region is formed more deeply than the $n^-$ diffusion region 67 of the source/drain region by implanting impurity ions into the photodiode regions at a higher energy.

The $n^-$ diffusion region 69 is deeply formed into the epitaxial layer 62 at high energy so as to increase the sensitivity of the image sensor.

The $n^-$ diffusion region 69 corresponds to the source region of the reset transistor (Rx in FIGS. 1 and 2).

In operation, when a reverse bias is applied between the $n^-$ diffusion region 69 of the photodiode and the $P^-$ epitaxial layer 62, a depletion region is formed. Electrons generated due to light lower the potential of the drive transistor when the reset transistor is turned off. When the reset transistor is turned off and then turned on, the potential is lowered so that a voltage difference occurs. The operation of the image sensor is achieved using the voltage difference in the signal processing.

According to the related art, the $n^-$ diffusion region 69 is formed to a depth of 2-4 μm, and the blue, green and red photodiode regions formed by the $n^-$ diffusion region 69 are of the same depth.

That is, the impurity ions are implanted into each photodiode region at the same ion implantation energy so that the photodiode region has the same depth.

Referring to FIG. 3D, after the second photoresist layer 68 is completely removed, an insulating layer is deposited on the entire surface of the semiconductor substrate 61 and an etch back process is performed to form gate spacers 70 on both sidewalls of the gate electrode 65.

A third photoresist layer 71 is then coated on the entire surface of the semiconductor substrate 61. The third photoresist layer 71 is patterned by an exposure process and a development process to cover the photodiode region and expose the source/drain region of each transistor.

Using the patterned third photoresist layer 71 as a mask, $n^+$ impurity ions are implanted into the exposed source/drain region to form an $n^+$ diffusion region 72.

Referring to FIG. 3E, the third photoresist layer 71 is removed and a fourth photoresist layer 73 is coated on the entire surface of the semiconductor substrate 61. The fourth photoresist layer 73 is patterned to expose each photodiode region using an exposure process and a development process.

Using the patterned fourth photoresist layer 73 as a mask, $p^0$ impurity ions are implanted into the photodiode region where the $n^-$ diffusion region 69 is formed, thereby forming a $p^0$ diffusion region 74 in the surface of the semiconductor substrate.

However, the related art method for fabricating the CMOS image sensor has the following problems.

By forming the blue, green and red photodiodes to the same depth, the difference of penetration depths from the silicon surface to the blue (~0.5 μm), green (~2 μm) and red (~10 μm) can be great due to silicon lattice structure. Consequently, the characteristic of the image sensor is degraded because it cannot effectively operate with respect to the blue and red pixels.

SUMMARY OF THE INVENTION

Accordingly, the present invention is directed to a CMOS image sensor and method for fabricating the same that addresses and/or substantially obviates one or more problems, limitations and/or disadvantages of the related art.

An object of the present invention is to provide a CMOS image sensor and a method for fabricating the same, capable of improving the characteristics of the image sensor by forming color photodiodes with consideration of the different penetration depths of silicon lattice structure due to wavelength difference of three primary colors.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CMOS image sensor incorporating: an epitaxial layer of a first conductivity type, formed in a semiconductor substrate of the first conductivity type; a blue photodiode region of a second conductivity type, formed in the epitaxial layer at a first depth; a green photodiode region of the second conductivity type, spaced apart from the blue photodiode region by a predetermined distance and formed in the epitaxial layer at a second depth larger than the first depth; and a red photodiode region of the second conductivity type, spaced apart from the green photodiode region by a predetermined distance and formed in the epitaxial layer at a third depth larger than the second depth.

In another aspect of the present invention, there is provided a method for fabricating a CMOS image sensor having blue, green and red photodiode regions, incorporating: forming an epitaxial layer of a first conductivity type in a surface of a semiconductor substrate; implanting impurity ions of a second conductivity type in a first predetermined portion of the epitaxial region to form the blue photodiode region having a first depth; implanting impurity ions of the second conductivity type in a second predetermined portion of the epitaxial region to form the green photodiode region spaced apart from the blue photodiode region and having a second depth larger than the first depth; and implanting impurity ions of the second conductivity type in a third predetermined portion of the epitaxial region to form the red photodiode region spaced apart from the green photodiode region and having a third depth larger than the second depth.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for fabricating the same according to the present invention will be described in detail with reference to accompanying drawings.

Figure 4:
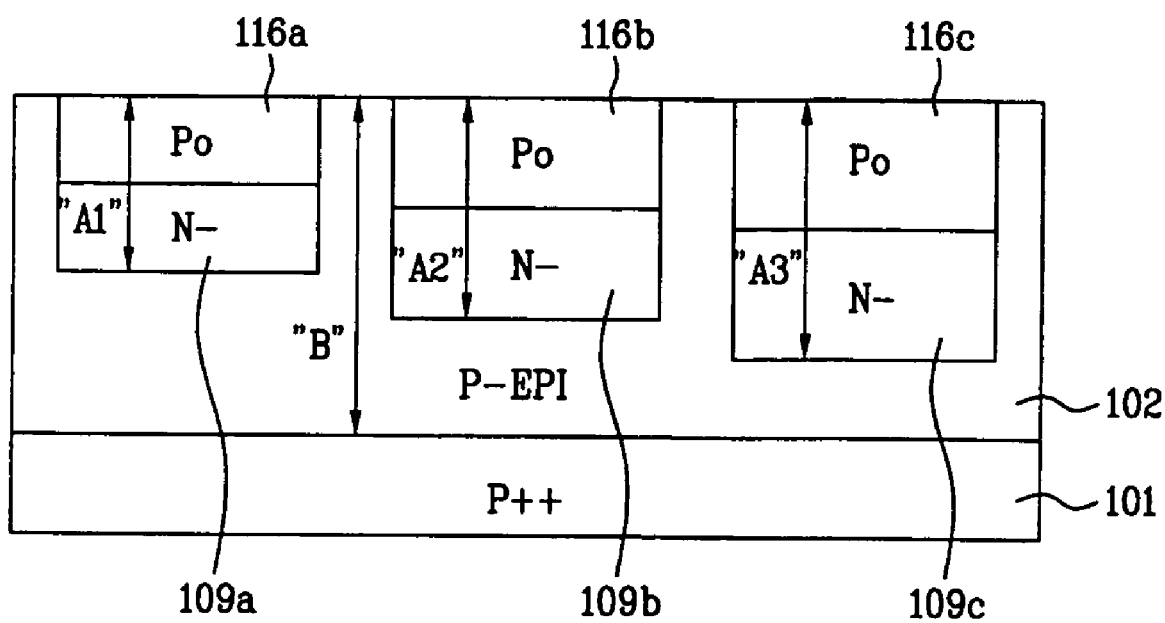
FIG. 4 is a sectional view of a photodiode of a CMOS image sensor according to an embodiment of the present invention.

FIG. 4 is a sectional view of a photodiode of a CMOS image sensor according to an embodiment of the present invention.

Referring to FIG. 4, a P$^-$ epitaxial layer 102 can be formed within a P$^{++}$ semiconductor substrate 101. A first n$^-$ doped region 109a can be formed for providing a blue photodiode region. In a specific embodiment, the n- doped region can have a depth of 1 μm or less within the epitaxial layer 102. A second n$^-$ doped region 109b can be formed for providing a green photodiode region spaced apart from the first n$^-$ doped region 109a by a predetermined distance. In a specific embodiment, the second n- doped region 109b can have a depth of 2-4 μm within the epitaxial layer 102. A third n$^-$ doped region 109c can be formed for providing a red photodiode region spaced apart from the second n$^-$ doped region 109b by a predetermined distance. In a specific embodiment, the third n- doped region 109c can have a depth of 3-6 μm within the epitaxial layer 102. A P$^0$ implant can form P$^0$ doped regions 116a, 116b, and 116c within the n$^-$ doped regions 109a, 109b, and 109c. The P$^0$ doped regions 116a, 116b, and 116c can be formed to different depths within their corresponding n– doped regions 109a, 109b, and 109c.

The first n$^-$ doped region 109a, the second n$^-$ doped region 109b, and the third n$^-$ doped region 109c are the blue photodiode region, the green photodiode region, and the red photodiode region, respectively.

In one embodiment, the first P$^0$ doped region 116a can be formed to have a depth of less than 0.3 μm. In a further embodiment, the third P$^0$ doped region 116c can be formed to have a depth of 0.3-1.0 μm.

In further embodiments of the subject invention, the epitaxial layer 102 can be formed to have a thickness of 4-7 μm.

Figure 1:
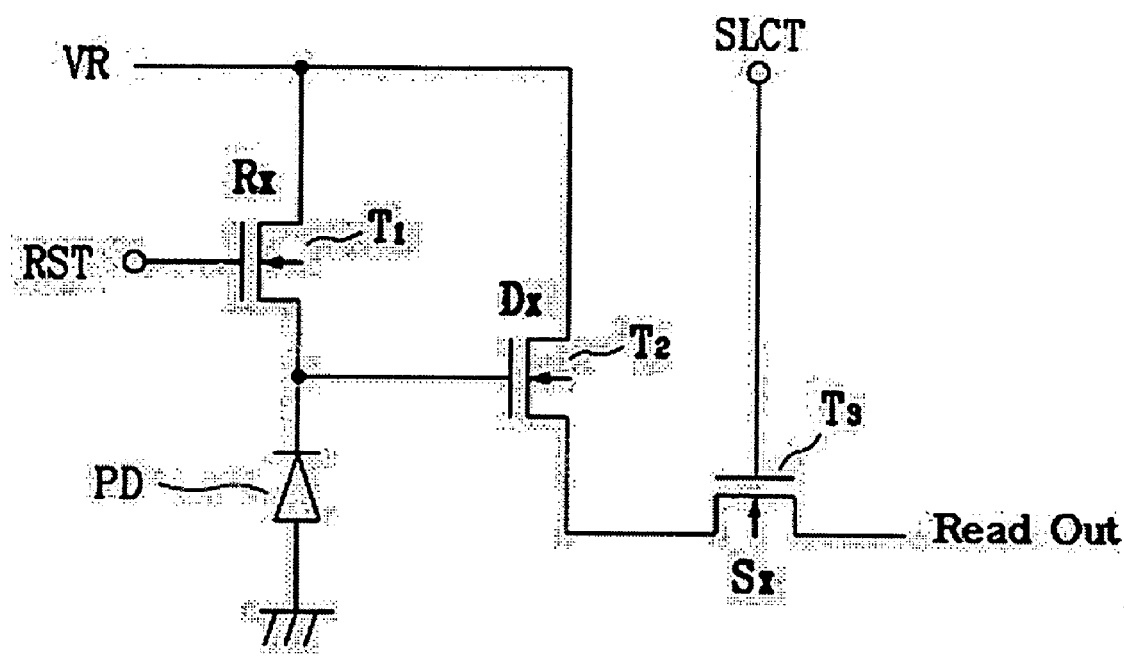
FIG. 1 is an equivalent circuit diagram of a related art 3T-type CMOS image sensor.
Figure 2:
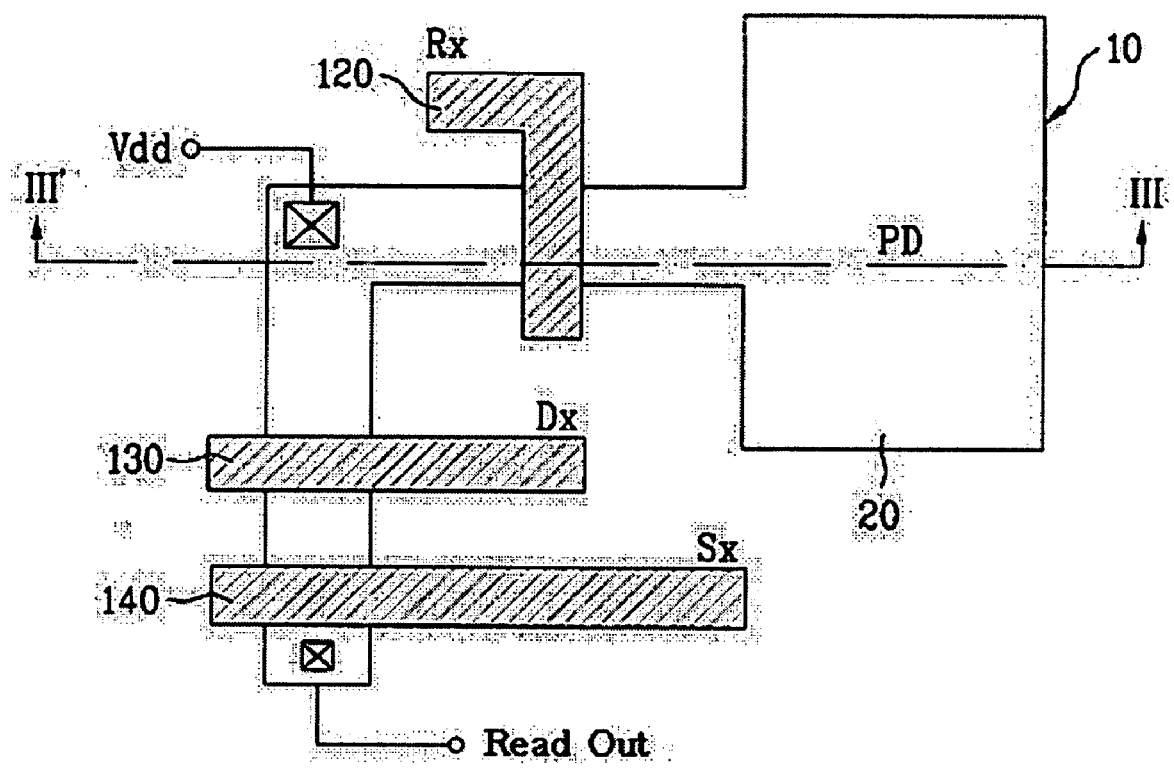
FIG. 2 is a layout of an unit pixel of a related art 3T-type CMOS image sensor.
Figure 3A:
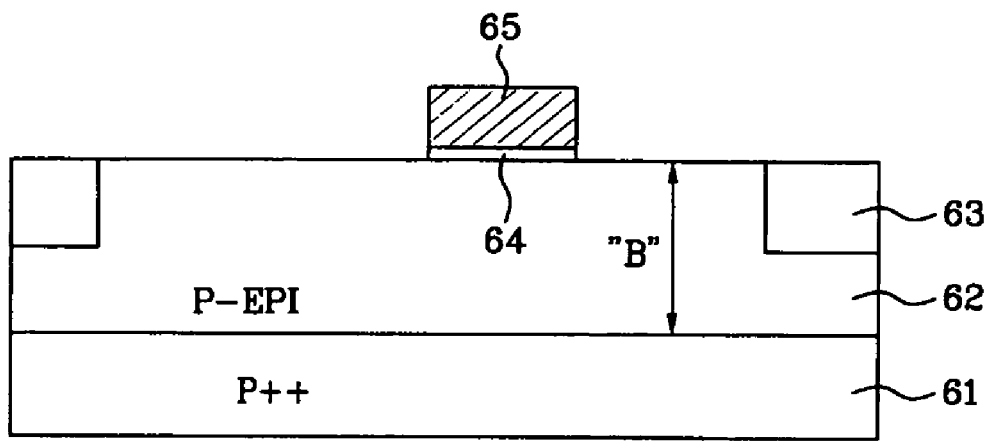
FIGS. 3A to 3E are sectional views taken along line III-III' of FIG. 2, illustrating a method for fabricating the related art CMOS image sensor.
Figure 3B:
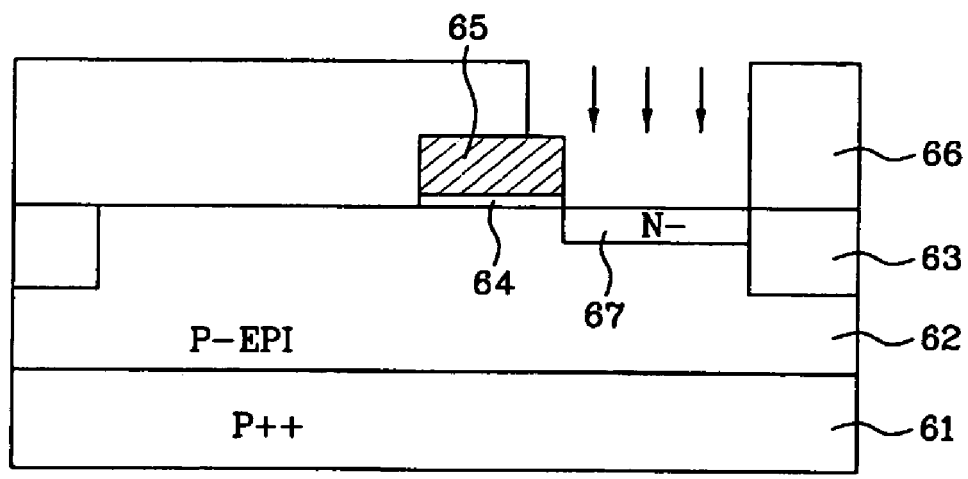
Figure 3C:
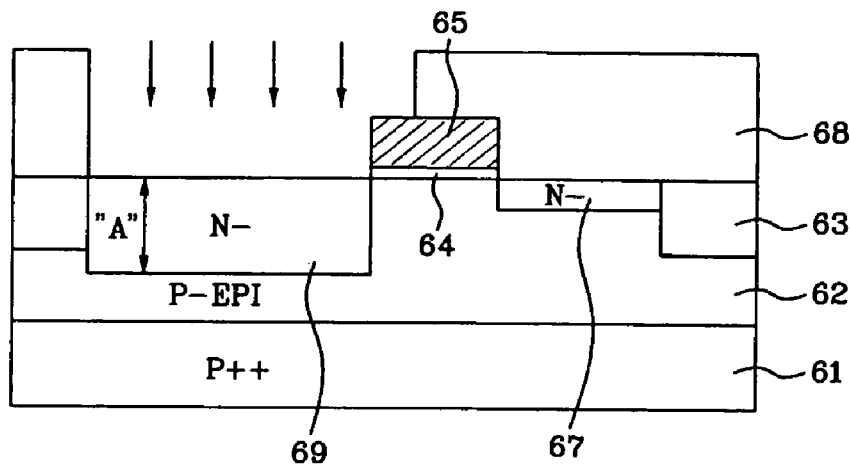
Figure 3D:
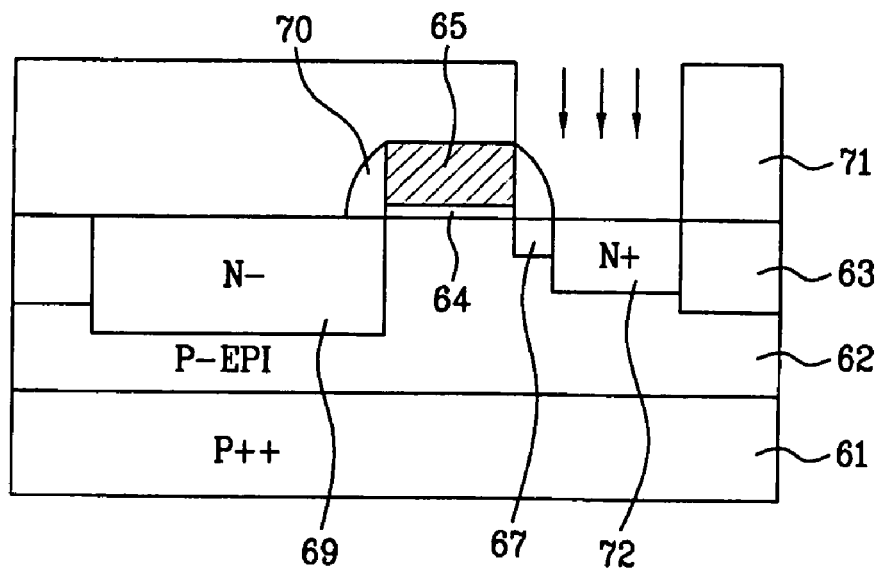
Figure 3E:
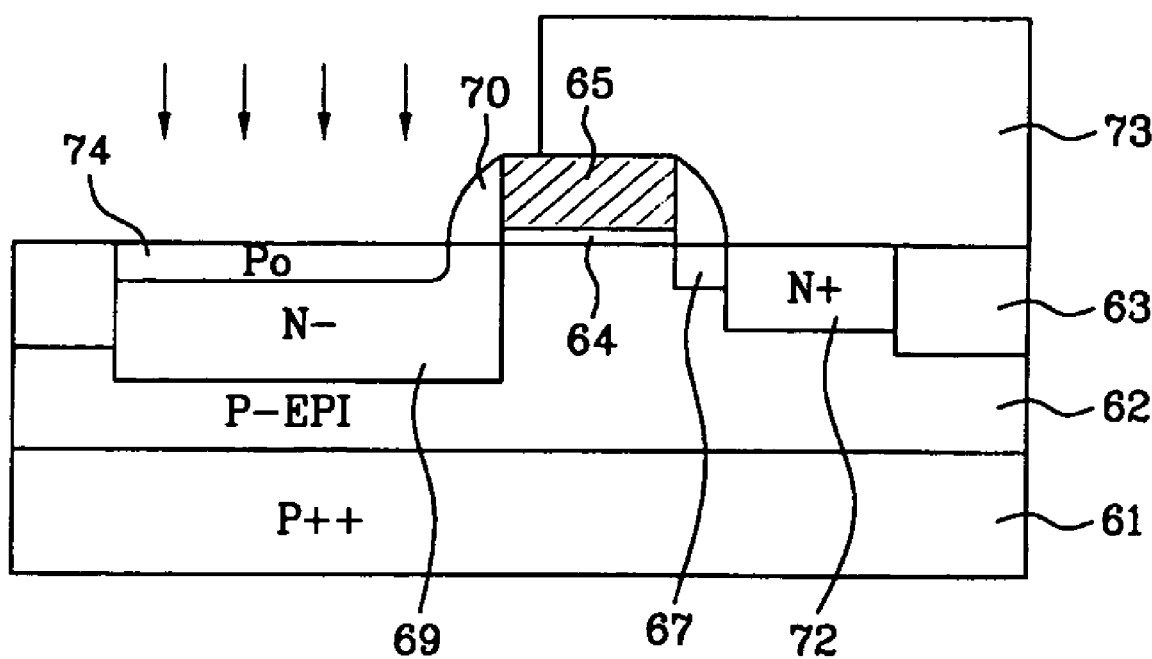

FIGS. 5A-5E, 6A-6B, and 7A-7B are sectional views taken along line 111-111' of FIG. 2, illustrating a method for fabricating the CMOS image sensor according to embodiments of the present invention.

Figure 5A:
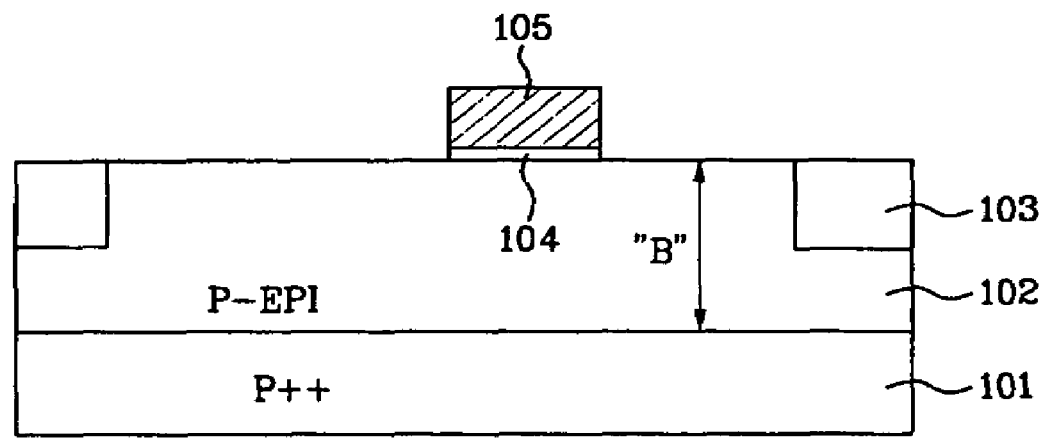
FIGS. 5A to 5E are sectional views taken along line III-III' of FIG. 2, encompassing a blue photodiode region, and illustrating a method for fabricating a CMOS image sensor according to an embodiment of the present invention.

Referring to FIG. 5A, a P$^-$ epitaxial layer 102 of a first conductivity type can be formed in a semiconductor substrate 101. The semiconductor substrate can be formed of a first P$^{++}$ single crystal silicon. In one embodiment, the epitaxial layer 102 can be formed by an epitaxial process.

The depth "B" of the epitaxial layer 102 can be selected to enable the formation of a depletion region largely and deeply in the photodiode so as to increase the ability of the low-voltage photodiode to accumulate photocharges and improve the optical sensitivity.

In an alternative embodiment, a p-type epitaxial layer can be formed in an n-type substrate.

In a specific embodiment, the P$^-$ epitaxial layer 102 can be formed to have a thickness B of 4-7 μm.

A device isolation layer 103 can be formed to isolate elements in the semiconductor substrate 101 where the epitaxial layer 102 is formed.

Although not shown, a method for forming the device isolation layer 103 will be described below.

First, a pad oxide layer, a pad nitride layer, and a Tetra Ethyl Ortho Silicate (TEOS) oxide layer can be sequentially formed on the semiconductor substrate. Next, a photoresist layer can be formed on the TEOS oxide layer.

Then, using a mask defining an active region and a device isolation region, the photoresist layer can be patterned using an exposure process and a development process. The exposing and developing processes can remove the photoresist layer covering the device isolation region.

The pad oxide layer, the pad nitride layer, and the TEOS oxide layer can be selectively removed using the patterned photoresist layer as a mask.

Next, using the patterned pad oxide layer, pad nitride layer, and TEOS oxide layer as a mask, the semiconductor substrate in the device isolation region can be etched to a predetermined depth to form a trench. Then, the photoresist layer can be completely removed.

A sacrifice oxide layer can be formed thinly on an entire surface of the semiconductor substrate where the trench is formed. An O$_3$ TEOS layer can be formed to fill the trench. The sacrifice oxide layer is also formed on the inner walls of the trench, and the O$_3$ TEOS layer is formed to about 1000 Å or more.

The O$_3$ TEOS layer can be removed through chemical mechanical polishing (CMP) such that it remains only in the trench region, thereby forming a device isolation layer 103 within the trench. Then, the pad oxide layer, the pad nitride layer, and the TEOS oxide layer are removed.

Referring back to FIG. 5A, a gate insulting layer 104 and a conductive layer can be sequentially formed on an entire surface of the epitaxial layer 102 where the device isolation layer is formed. In one embodiment, the conductive layer can be a high-concentration polycrystalline silicon layer.

In one embodiment, the gate insulating layer 104 can be formed using a thermal oxidation process or CVD process.

The conductive layer and the gate insulating layer can be selectively removed to form a gate electrode 105.

Figure 5B:
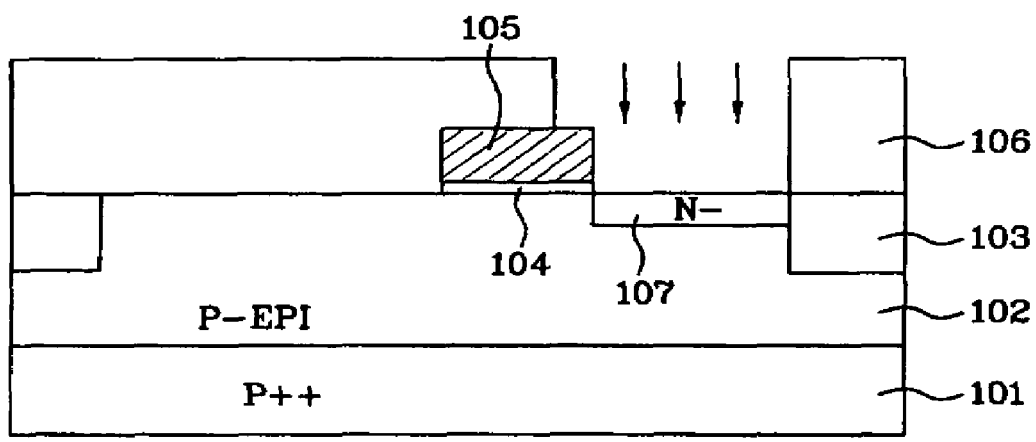

Referring to FIG. 5B, a first photoresist layer 106 can be coated on the entire surface of the resulting structure including the gate electrode 105, and can be patterned using an exposure process and a development process to cover the photodiode region and expose the source/drain region of each transistor.

Using the patterned first photoresist layer 106 as a mask, n-type impurity ions can be implanted into the exposed source/drain region to form an $n^-$ diffusion region 107.

Figure 5C:
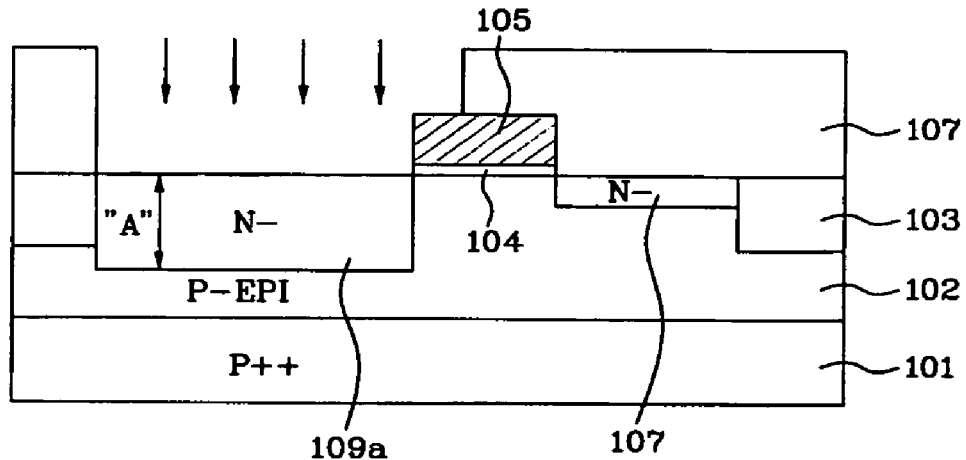

Referring to FIG. 5C, the first photoresist layer 106 can be removed and a second photoresist layer 108 can be coated on the entire surface of the semiconductor substrate 101. The second photoresist layer 108 can be patterned to expose a blue photodiode region using an exposure process and a development process.

Using the patterned second photoresist layer 108 as a mask, n-type impurity ions can be implanted into the epitaxial layer 102 to form a first $n^-$ diffusion region 109a in the blue photodiode region.

In a specific embodiment, a depth A of the first $n^-$ diffusion region 109a formed in the blue photodiode region is about 1 µm or less from the surface.

Figure 6A:
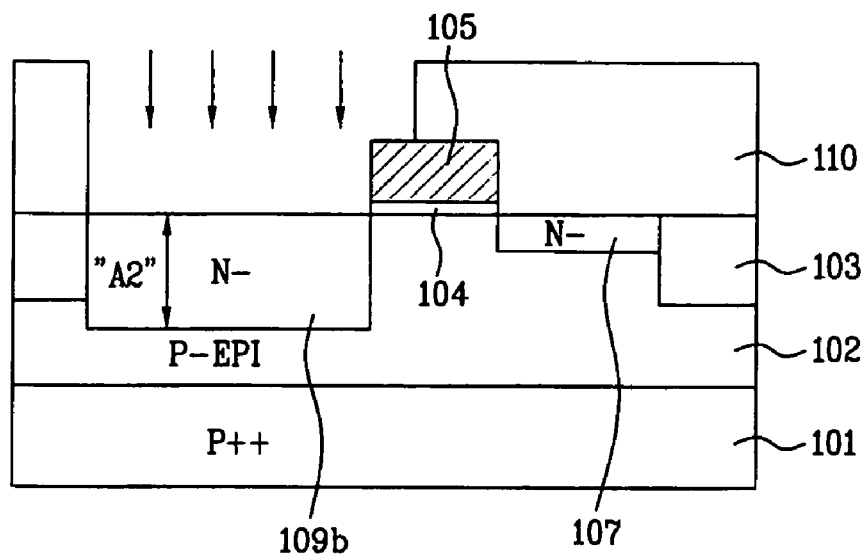
FIGS. 6A and 6B are sectional views taken along line III-III' of FIG. 2, illustrating a cross section encompassing a green photodiode region and a red photodiode region, respectively, for a process for fabricating a CMOS image sensor according to embodiments of the present invention.

Referring to FIG. 6A, after the second photoresist layer 108 is completely removed, a third photoresist layer 110 can be coated on the entire surface of the semiconductor substrate 101 and patterned to expose the green photoresist region using an exposure process and a development process.

Using the patterned third photoresist layer 110 as a mask, n-type impurity ions can be implanted into the epitaxial layer 102 to form a second $n^-$ diffusion region 109b in the green photodiode region.

In a specific embodiment, a depth A2 of the second $n^-$ diffusion region 109a formed in the green photodiode region is 2-4 µm from the surface.

Figure 6B:
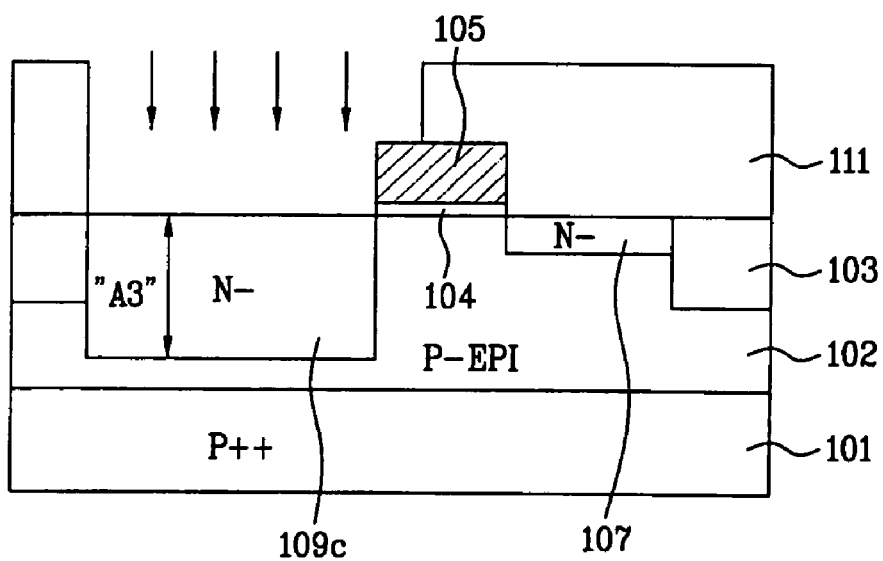

Referring to FIG. 6B, after the third photoresist layer 110 is removed, a fourth photoresist layer 111 can be coated on the entire surface of the semiconductor substrate 101 and patterned to expose the red photodiode region using an exposure process and a development process.

Using the patterned fourth photoresist layer 111 as a mask, n-type impurity ions can be implanted into the epitaxial region 102 to form a third $n^-$ diffusion region 109c in the surface of the red photodiode region.

In a specific embodiment, a depth A3 of the third $n^-$ diffusion region 109c formed in the red photodiode region is 3-6 µm from the surface.

The first, second, and third $n^-$ diffusion regions 109a, 109b, and 109c of each photodiode region can be formed more deeply and at higher implantation energies than the $n^-$ diffusion region 107 of the source/drain region.

Figure 5D:
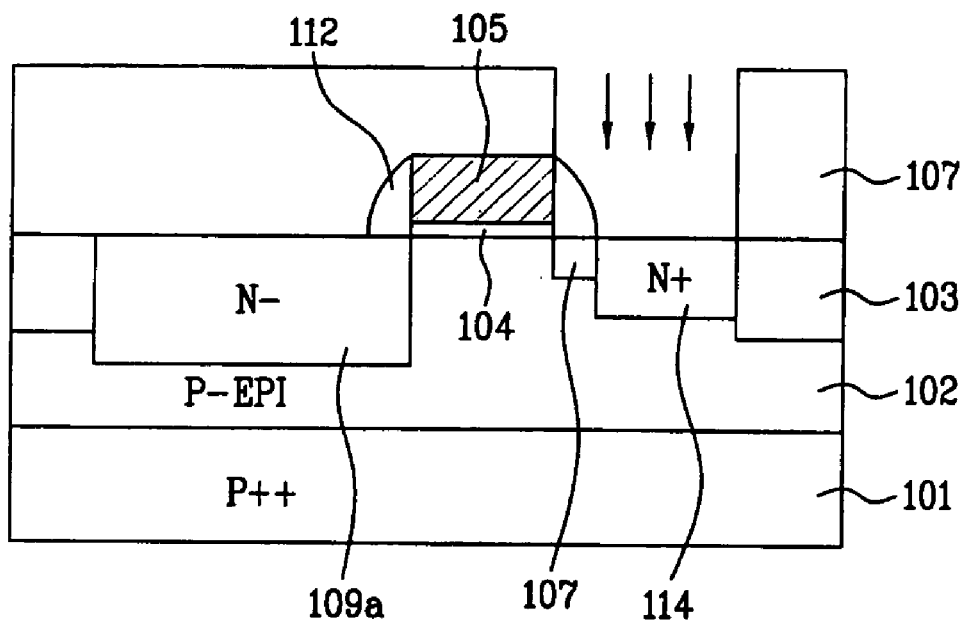

Referring to FIG. 5D, after the fourth photoresist layer 111 is completely removed, an insulating layer can be deposited on the entire surface of the semiconductor substrate 101. In one embodiment, an etch back process can be performed to form gate spacers 112 on both sidewalls of the gate electrode 105.

A fifth photoresist layer 113 can be coated on the entire surface of the semiconductor substrate 101, and can be patterned by an exposure process and a development process to cover the photodiode region and expose the source/drain region of each transistor.

Using the patterned fifth photoresist layer 113 as a mask, $n^+$ impurity ions can be implanted into the exposed source/drain region to form an $n^+$ diffusion region 114.

Figure 5E:
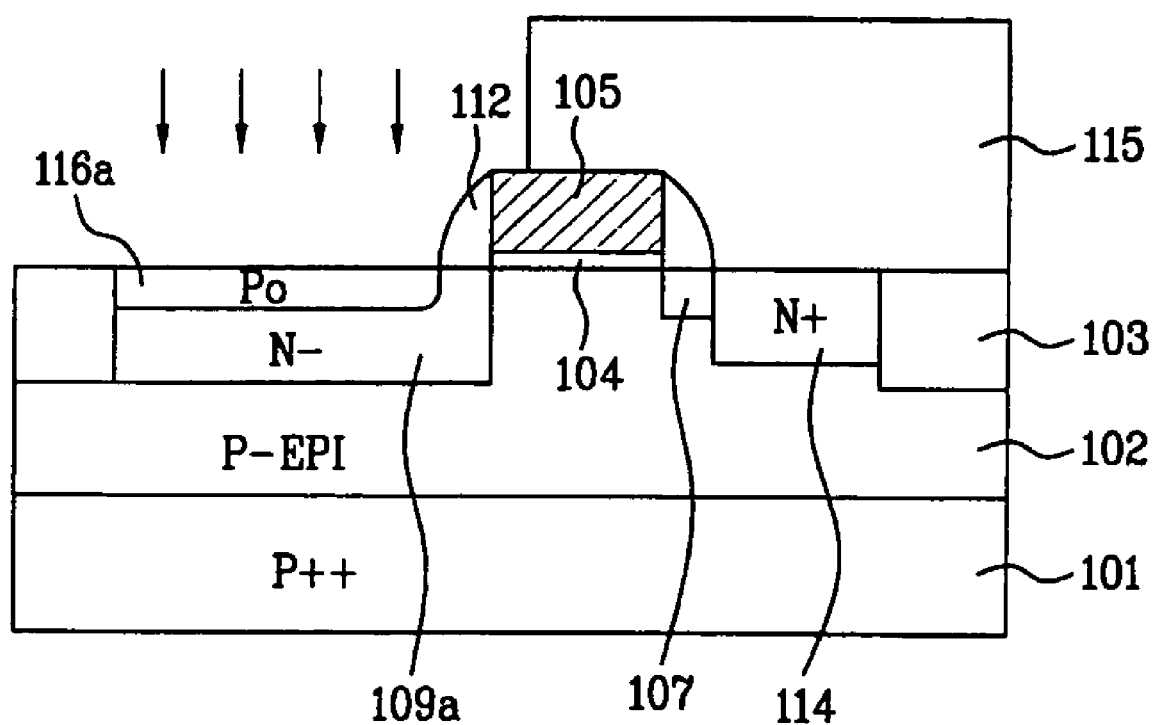

Referring to FIG. 5E, the fifth photoresist layer 113 can be removed and a sixth photoresist layer 115 can be coated on the entire surface of the semiconductor substrate 101. The fifth photoresist layer 113 can be patterned to expose a portion of each photodiode region using an exposure process and a development process.

Using the patterned sixth photoresist layer 115 as a mask, $p^0$ impurity ions can be implanted into the photodiode region where the first $n^-$ diffusion region 109a is formed, thereby forming a first $p^0$ diffusion region 116a in the surface of the semiconductor substrate.

In a specific embodiment, a depth of the first $P^0$ diffusion region 116a is 0.3 µm or less.

Figure 7A:
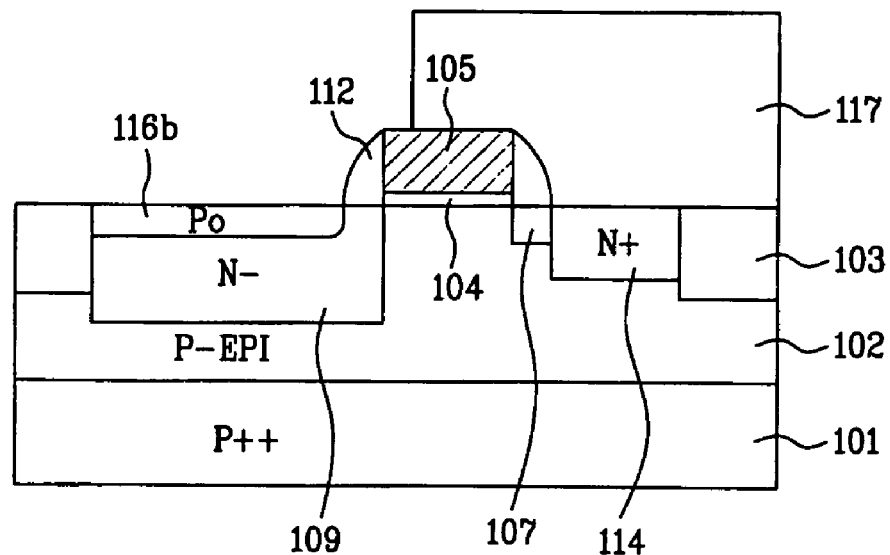
FIGS. 7A and 7B are sectional views taken along line III-III' of FIG. 2, illustrating a cross section encompassing a green photodiode region and a red photodiode region, respectively, for a process for fabricating a CMOS image sensor according to embodiments of the present invention.

Referring to FIG. 7A, the sixth photoresist layer 115 can be removed and a seventh photoresist layer 117 can be coated on the entire surface of the semiconductor substrate 101. The seventh photoresist layer 113 can be patterned to expose a portion of each photodiode region using an exposure process and a development process.

Using the patterned seventh photoresist layer 117 as a mask, $p^0$ impurity ions can be implanted into the photodiode region where the second $n^-$ diffusion region 109b is formed, thereby forming a second $p^0$ diffusion region 116b in the surface of the semiconductor substrate.

Figure 7B:
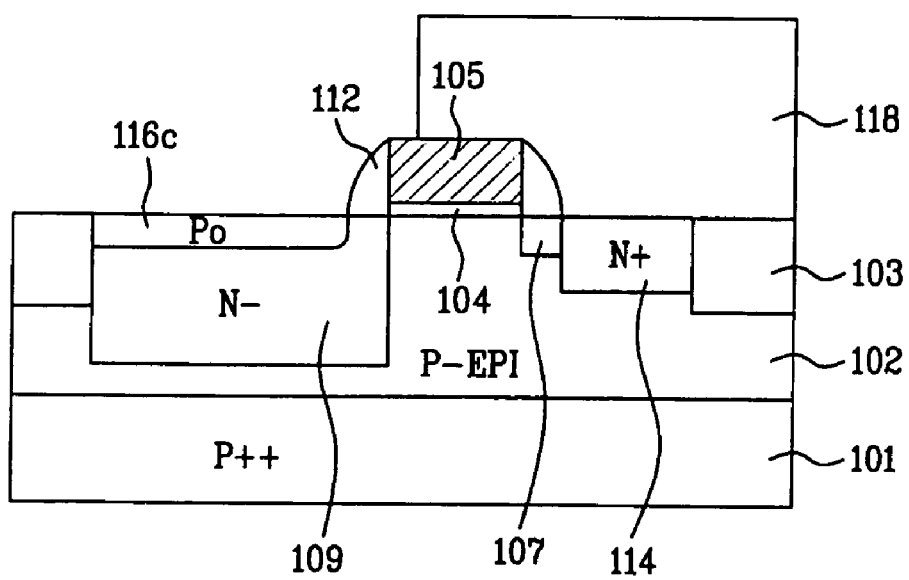

Referring to FIG. 7B, the seventh photoresist layer 117 can be removed and an eighth photoresist layer 118 can be coated on the entire surface of the semiconductor substrate 101. The eighth photoresist layer 113 can be patterned to expose a portion of each photodiode region using an exposure process and a development process.

Using the patterned eighth photoresist layer 118 as a mask, $p^0$ impurity ions can be implanted into the photodiode region where the third $n^-$ diffusion region 109c is formed, thereby forming a third $p^0$ diffusion region 116c in the surface of the semiconductor substrate.

In a specific embodiment, a depth of the third $P^0$ diffusion region 116c is 0.3-1.0 µm.

The CMOS image sensor and the method for fabricating the same according to the present invention can have the following effect.

The characteristic of the image sensor can be improved by forming the blue, green and red photodiode regions to different depths, considering the penetration depth of the light energy.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for fabricating a CMOS image sensor having blue, green and red photodiode regions, comprising:

forming an epitaxial layer of the first conductivity type in a surface of a semiconductor substrate;

implanting impurity ions of a second conductivity type in a first predetermined portion of the epitaxial layer to form the blue photodiode region having a first depth, wherein the implanting of the impurity ions in the first predetermined portion comprises patterning a first photoresist layer to expose only the first predetermined portion of the epitaxial layer and using the patterned first photoresist layer as an implantation mask for the blue photodiode region;

implanting impurity ions of the second conductivity type in a second predetermined portion of the epitaxial layer to form the green photodiode region having a second depth larger than the first depth, wherein the implanting of the impurity ions in the second predetermined portion comprises patterning a second photoresist layer to expose only the second predetermined portion of the epitaxial layer and using the patterned second photoresist layer as an implantation mask for the green photodiode region; and implanting impurity ions of the second conductivity type in a third predetermined portion of the epitaxial layer to form the red photodiode region having a third depth larger than the second depth, wherein the implanting of the impurity ions in the third predetermined portion comprises patterning a third photoresist layer to expose only the third predetermined portion of the epitaxial layer and using the patterned third photoresist layer as an implantation mask for the red photodiode region.

2. The method according to claim 1, wherein the first depth is 1 μm or less.

3. The method according to claim 1, wherein the second depth is between 2 μm and 4 μm.

4. The method according to claim 1, wherein the third depth is between 3 μm and 6 μm.

5. The method according to claim 1, further comprising forming a first doped region of the first conductivity type in the epitaxial layer at the blue photodiode region, forming a second doped region of the first conductivity type in the epitaxial layer at the green photodiode region, and forming a third doped region of the first conductivity type in the epitaxial region at the red photodiode regions, wherein the first doped region, the second doped region, and the third doped region are formed at different depths.

6. The method according to claim 1, wherein the epitaxial layer is formed to have a thickness of between 4 μm and 7 μm.

7. The method according to claim 5, wherein the first doped region has a depth of 0.3 μm or less.

8. The method according to claim 5, wherein the third doped region has a depth of between 0.3 μm and 1.0 μm.

* * * * *